(12) United States Patent
Kuramochi et al.

(10) Patent No.: US 11,391,887 B2
(45) Date of Patent: Jul. 19, 2022

(54) PHOTONIC CRYSTAL OPTICAL ELEMENT HAVING AN ACTIVE MEDIUM IN A LIGHT CONFINEMENT PORTION

(71) Applicant: Nippon Telegraph and Telephone Corporation, Tokyo (JP)

(72) Inventors: Eiichi Kuramochi, Tokyo (JP); Akihiko Shinya, Tokyo (JP); Masaya Notomi, Tokyo (JP); Kengo Nozaki, Tokyo (JP); Masato Takiguchi, Tokyo (JP); Kenta Takata, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 34 days.

(21) Appl. No.: 17/258,098

(22) PCT Filed: Jul. 9, 2019

(86) PCT No.: PCT/JP2019/027115
§ 371 (c)(1),
(2) Date: Jan. 5, 2021

(87) PCT Pub. No.: WO2020/013171
PCT Pub. Date: Jan. 16, 2020

(65) Prior Publication Data
US 2021/0231867 A1    Jul. 29, 2021

(30) Foreign Application Priority Data
Jul. 11, 2018    (JP) .............................. JP2018-131402

(51) Int. Cl.
*G02B 6/122*    (2006.01)
*H01S 5/11*    (2021.01)

(52) U.S. Cl.
CPC .............. *G02B 6/1225* (2013.01); *H01S 5/11* (2021.01)

(58) Field of Classification Search
None
See application file for complete search history.

(56) References Cited

U.S. PATENT DOCUMENTS

| | | | |
|---|---|---|---|
| 7,209,622 B2* | 4/2007 | Hoshi ................... | G02B 6/1225 385/129 |
| 2006/0275005 A1* | 12/2006 | Hoshi ................... | G02B 6/1225 385/129 |
| 2021/0231867 A1* | 7/2021 | Kuramochi ............ | G02B 1/005 |

FOREIGN PATENT DOCUMENTS

JP    6317279 B2    4/2018

OTHER PUBLICATIONS

Kuramochi, Eiichi, et al., "Large-scale integration of wavelength-addressable all-optical memories on a photonic crystal chip," Nature Photonics, vol. 8, Jun. 2014, p. 474-481.
(Continued)

*Primary Examiner* — Andrew Jordan
(74) *Attorney, Agent, or Firm* — Slater Matsil, LLP

(57) ABSTRACT

The amount of outward shift of a lattice element (131a) and a lattice element (131b), the outward shift being symmetrical with respect to a resonator center on a straight line, is 0.42 to 0.5 times a lattice constant of a photonic crystal. The amount of outward shift of a lattice element (132a) and a lattice element (132b), the outward shift being symmetrical with respect to the resonator center on the straight line, is 0.26 to 0.38 times the lattice constant of the photonic crystal. The amount of outward shift of a lattice element (133a) and a lattice element (133b), the outward shift being symmetrical with respect to the resonator center on the straight line, is 0.13 to 0.19 times the lattice constant of the photonic crystal. The amount of outward shift of a lattice element
(Continued)

(134*a*) and a lattice element (134*b*), the outward shift being symmetrical with respect to the resonator center on the straight line, is −0.1 to 0 times the lattice constant of the photonic crystal.

14 Claims, 2 Drawing Sheets

(56) References Cited

OTHER PUBLICATIONS

Kuramochi, Eiichi, et al., "Systematic hole-shifting of L-type nanocavity with an ultrahigh Q factor," Optics Letters, vol. 39, No. 19, Oct. 1, 2014, p. 5780-5783.

Matsuo, Shinji, et al., "Ultralow Operating Energy Electrically Driven Photonic Crystal Lasers," IEEE Journal of Selected Topics in Quantum Electronics, vol. 19, No. 4, Jul./Aug. 2013, 11 pages.

\* cited by examiner

PHOTONIC CRYSTAL OPTICAL ELEMENT HAVING AN ACTIVE MEDIUM IN A LIGHT CONFINEMENT PORTION

CROSS-REFERENCE TO RELATED APPLICATIONS

This application is a national phase entry of PCT Application No. PCT/JP2019/027115, filed on Jul. 9, 2019, which claims priority to Japanese Application No. 2018-131402, filed on Jul. 11, 2018, which applications are hereby incorporated herein by reference.

TECHNICAL FIELD

The present invention relates to a photonic crystal optical device that is constituted by a two-dimensional slab-type photonic crystal.

BACKGROUND

In recent years, optical communication technology has become indispensable in order to deal with the increasing data volume of communication and the Internet. In optical communication technology, it is necessary to multiplex, demultiplex, and process optical signals transmitted by optical fibers for each line, and perform processing to send the processed signals to the optical fibers again. Regarding optical components that perform such processing, integrated on-chip optical circuitry on a single chip is becoming more and more common.

In addition, data transmission in data centers and high-performance computers (HPCs) has been performed by means of optical fiber communication, and a large number of compact and mass-producible surface-emitting lasers (VCSELs) have been employed as light sources. In VCSEL products, the footprint of a single laser is set to 10 μm or more, and the pitch of an array is set to 100 μm or more in order to achieve sufficient performance in practical use.

Photonic crystals are becoming more and more important for further miniaturization and high integration of optical integrated circuits and for the realization of nano-lasers that are even smaller and more power efficient than VCSELs.

Photonic crystals are artificial materials that form a photonic band structure due to lattice elements with a cylindrical shape or the like and a low refractive index being periodically arranged in a medium with a high refractive index, and realize control of light propagation. In particular, a photonic bandgap (PBG), in which a photonic crystal serves as light insulator, can be used to realize a nano-resonator that confines light to a small volume on a wavelength scale, and a nano-waveguide that confines light to a width corresponding to several crystal holes.

Since a photonic crystal period is around 1/n (n: refractive index of the medium) of the optical wavelength in the vacuum, photonic crystals are expected to reduce the size of optical integrated circuits by around one order of magnitude, and reduce power consumption by one order of magnitude or more, compared to the existing optical integrated circuits. Recently, current-injection room-temperature CW oscillation of a photonic crystal laser has been realized (see Non-Patent Literature 1), and a 100-bit on-chip integrated optical memory has also been realized (see Non-Patent Literature 2). Thus, the performance of photonic crystal optical components is becoming more and more practical.

A nano-resonator with a photonic crystal has a light confinement mode that is formed with a PBG that a surrounding photonic crystal has in a defective portion, which is formed by removing several crystal holes. The mode volume V in the light confinement mode is approximately $1(\lambda_c/n)^3$ ($\lambda_c$: resonant mode wavelength). Recent advances in resonator design have enabled the Q factor in the confinement mode to be 10,000 or more, and it is characteristic that an extremely large Q/V factor that is difficult to achieve with anything other than photonic crystals can be achieved.

An L-resonator is one of the aforementioned nano-resonators with a photonic crystal. The L-resonator has a light confinement portion with a linear arrangement of point defects formed by removing lattice elements of a two-dimensional slab-type photonic crystal. For example, an L1 resonator is constituted by one point defect formed by removing a lattice element from a lattice with lattice elements of a photonic crystal. An L2 resonator is constituted by two point defects. An L3 resonator is constituted by three point defects. In such L-resonators, a plurality of point defects are linearly arranged along a Γ-K crystal orientation.

The L3 resonators, of the nano-resonators, have attracted attention because of the small size and a high Q factor thereof, and the use of the L3 resonators in laser devices to take advantage of a strong resonator enhancement effect has been considered from early. It has also been reported that the L3 resonators are promising as optical memories that enable high-capacity integration. In addition, the compact L1 and L2 resonators have not attracted much attention since a design that increases the Q factor had not been found until recently. Recently, however, a design of the L1 and L2 resonators that makes the Q factor significantly higher than that of the conventionally-designed L3 resonators has been found. For example, it has been reported that, in order to further enhance the Q factor of the L1-L3 resonators, the Q factor in a resonator base mode is increased by shifting lattice elements on a main axis (on the extension of the main axis) on which point defects are arranged, away from the resonator center at which the point defects are arranged (i.e. outward) (see Patent Literature 1 and Non-Patent Literature 3).

CITATION LIST

Patent Literature

PTL 1 Japanese Patent No. 6317279

Non Patent Literature

NPL 1 S. Matsuo, T. Sato, K. Takeda, A. Shinya, K. Nozaki, H. Taniyama, M. Notomi, K. Hasebe, and T. Kakitsuka, "Ultralow Operating Energy Electrically Driven Photonic Crystal Lasers", IEEE Journal of Selected Topics in Quantum Electronics, Vol. 19, No. 4, 4900311, 2013;

NPL 2 E. Kuramochi, K. Nozaki, A. Shinya, K. Takeda, T. Sato, S. Matsuo, H. Taniyama, H. Sumikura and M. Notomi, "Large-scale integration of wavelength-addressable all-optical memories on a photonic crystal chip", Nature Photonics, Vol. 8, pp. 474-481, 2014;

NPL 3 E. Kuramochi, E. Grossman, K. Nozaki, K. Takeda, A. Shinya, H. Taniyama, and M. Notomi, "Systematic hole-shifting of L-type nanocavity with an ultrahigh Q factor", Optics LETTERS, Vol. 39, No. 19, pp. 5780-5783, 2014.

SUMMARY

Technical Problem

A photonic crystal nano-resonator is an optical device of the smallest class that confines light to a resonator with a micro-size that is approximately equal to the wavelength of light, or several μm in terms of optical fiber communication wavelength. Meanwhile, an ordinary semiconductor laser device has a much larger resonator size that is sub-mm to several mm. As the study of nano-resonator lasers progresses, it has become apparent that there are problems specific to nano-lasers that are not issues in ordinary semiconductor lasers.

For example, in the case of a laser device, the gain of the laser in a specific resonant mode is brought about by an interaction between a resonant-mode electric field and an active layer. In the resonant mode, there are a large number of periodic nodes and antinodes corresponding to the wavelength (about the lattice constant of a photonic crystal) in a medium. However, in an ordinary semiconductor laser, there are a large number of antinodes in the active layer, and therefore, the relationship between the position of each antinode and device characteristics is weak.

Meanwhile, for example, in a nano laser with a single quantum dot as an active layer, whether or not the quantum dot is in a field antinode portion is decisive for whether or not the laser oscillates.

In the case of an L-resonator with a small number of point defects, the resonant-mode electric field is concentrated on a few antinodes near the center, and thus, the positional relationship with the active layer is important. In the case of an L-resonator with odd-numbered point defects (L1, L3 etc.), one electric-field antinode is generated at the resonator center in the base mode due to the symmetry of the photonic crystal. Since a small active layer, such as a quantum dot or a quantum well embedded heterostructures (BH) used in Non-Patented Literatures 1 and 2, is arranged at the resonator center, it is convenient that the resonator center is an antinode, for the sake of increasing the efficiency of optical devices such as lasers.

In contrast, in the case of an L-resonator with even-numbered point defects (L2, L4, etc.), the resonator center in the base mode is a node of the electric field due to the symmetry of the photonic crystal. In this case, the interaction between the base mode and the active layer weakens near the resonator center, and there is, therefore, concern a non-negligible decrease in device efficiency will be caused, especially in the L2 type whose resonator size is small.

Embodiments of the present invention have been made to solve the foregoing problems, and it is an object of embodiments of the present invention to enable an optical device such as a laser that uses an L2 resonator, which is constituted by a two-dimensional slab-type photonic crystal and performs active operation with an active layer, to operate in a first-order higher resonant mode.

Means for Solving the Problem

A photonic crystal optical device according to embodiments of the present invention includes: a photonic crystal body including: a base portion; and a plurality of lattice elements with a columnar shape that are periodically provided in a triangular lattice shape at intervals of a wavelength of target light or less in the base portion, the plurality of lattice elements having a refractive index different from that of the base portion; a light confinement portion provided in the photonic crystal body and formed with two point defects constituted by a portion in which no lattice element of a photonic crystal is present; an active medium provided in the light confinement portion; and a first lattice element pair, a second lattice element pair, a third lattice element pair, and a fourth lattice element pair that are constituted by eight lattice elements continuously arranged on a straight line in a direction of a Γ-K crystal orientation of the photonic crystal on two sides of the light confinement portion, with the light confinement portion at a center, wherein an amount of outward shift of the first lattice element pair that is a first pair from the center, the outward shift being symmetrical with respect to the center on the straight line, is 0.42 to 0.5 times a lattice constant of the photonic crystal, an amount of outward shift of the second lattice element pair that is a second pair from the center, the outward shift being symmetrical with respect to the center on the straight line, is 0.26 to 0.38 times the lattice constant of the photonic crystal, an amount of outward shift of the third lattice element pair that is a third pair from the center, the outward shift being symmetrical with respect to the center on the straight line, is 0.13 to 0.19 times the lattice constant of the photonic crystal, and an amount of outward shift of the fourth lattice element pair that is a fourth pair from the center, the outward shift being symmetrical with respect to the center on the straight line, is −0.1 to 0 times the lattice constant of the photonic crystal.

In the above-described photonic crystal optical device, the base portion is made of a semiconductor having a refractive index of 2 or more at an operating wavelength.

In the above-described photonic crystal optical device, the active medium is provided at a center of the light confinement portion.

In the above-described photonic crystal optical device, the active medium is excited by means of current injection.

Effects of Embodiments of the Invention

As described above, according to embodiments of the present invention, the first lattice element pair, the second lattice element pair, the third lattice element pair, and the fourth lattice element pair arranged on two sides of the light confinement portion with this light confinement portion at the center are shifted by a predetermined amount. Thus, it is possible to obtain the excellent effect that an optical device such as a laser that uses an L2 resonator, which is constituted by a two-dimensional slab-type photonic crystal and performs active operation with an active layer is enabled to operate in a first-order higher resonant mode.

DETAILED DESCRIPTION OF ILLUSTRATIVE EMBODIMENTS

Figure 1:
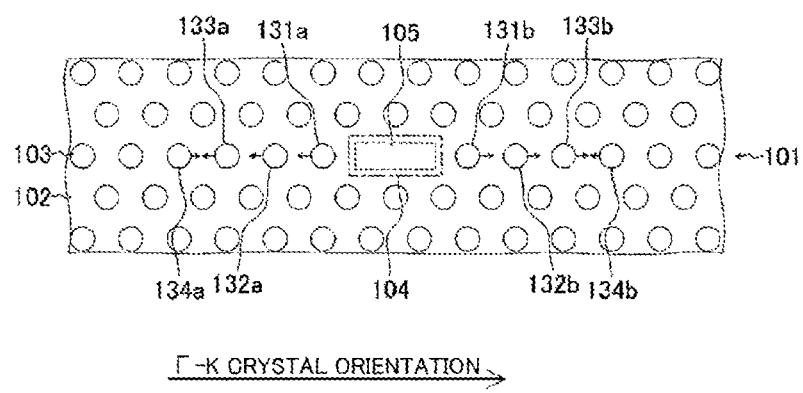
FIG. 1 is a plan view showing a configuration of a photonic crystal optical device in an embodiment of the present invention.

Hereinafter, a photonic crystal optical device according to the embodiment of the present invention will be described with reference to FIG. 1. This photonic crystal optical device is constituted by a base portion 102 and a photonic crystal body 101. Here, the photonic crystal body 101 includes a plurality of lattice elements 103 with a columnar shape that are periodically provided in a triangular lattice at intervals of a wavelength of target light or less in the base portion 102, the plurality of lattice elements 103 having a refractive index different from that of the base portion 102. The photonic crystal body 101 is a so-called two-dimensional slab-type photonic crystal. The lattice elements 103 have, for example, a cylindrical hollow structure. The base portion 102 is made of a semiconductor that has a refractive index value of 2 or more at an operating wavelength, such as indium phosphorus or silicon.

In addition, this photonic crystal optical device includes a light confinement portion 104 that is provided in the photonic crystal body 101, and is formed with two point defects provided in a portion in which no lattice element 103 of the photonic crystal is present.

An active medium 105 is provided (embedded) in the light confinement portion 104. The active medium 105 is provided, for example, at the center of the light confinement portion 104. In this embodiment, the active medium 105 has a BH structure with a size that fits into the light confinement portion 104. For example, the active medium 105 has a multiple quantum well structure constituted by three quantum well layers that are made of InGaAs and a barrier layer that is made of InGaAsP. Alternatively, the active medium 105 may be constituted by a single or a plurality of quantum dots, rather than quantum well layers. The active medium 105 is not limited to the BH structure, and may alternatively be distributed in the photonic crystal body 101 surrounding the light confinement portion 104.

An active optical device is constituted by a resonator that is formed with the active medium 105 and the light confinement portion 104. The photonic crystal optical device in the embodiment is a laser. It has been reported that laser oscillation occurs even in conventionally-known photonic crystal nano-resonators with a Q factor of 1,000 to 10,000, in the case where the gain is generated in the active layer by means of light excitation, or where pulse oscillation is also caused by means of current injection. On the other hand, as for the case of causing continuous oscillation at room temperature by means of DC current injection, there has been no report of oscillation except for photonic crystal nano-resonators with a resonator-internal Q factor of more than tens of thousands, such as those described in Patent Literature 1 and Non-Patent Literatures 1 and 2. Therefore, embodiments of the present invention that increases the Q factor in the oscillation mode is particularly important for current-injection oscillation laser devices.

The photonic crystal optical device according to embodiments of the present invention includes a first lattice element pair, a second lattice element pair, a third lattice element pair, and a fourth lattice element pair that are constituted by eight lattice elements, which are continuously arranged on a straight line in the direction of the Γ-K crystal orientation of the photonic crystal on two sides of the aforementioned light confinement portion 104, with this light confinement portion 104 at the center. Here, the first lattice element pair is constituted by a lattice element 131a and a lattice element 131b. The second lattice element pair is constituted by a lattice element 132a and a lattice element 132b. The third lattice element pair is constituted by a lattice element 133a and a lattice element 133b. The fourth lattice element pair is constituted by a lattice element 134a and a lattice element 134b.

Note that the lattice element 131a and the lattice element 131b are symmetrically arranged on a straight line in the direction of the Γ-K crystal orientation with the resonator center at the center therebetween. The lattice element 132a and the lattice element 132b are symmetrically arranged on a straight line in the direction of the Γ-K crystal orientation with the resonator center at the center therebetween. The lattice element 133a and the lattice element 133b are symmetrically arranged on a straight line in the direction of the Γ-K crystal orientation with the resonator center at the center therebetween. The lattice element 134a and the lattice element 134b are symmetrically arranged on a straight line in the direction of the Γ-K crystal orientation with the resonator center at the center therebetween.

The positions of the lattice elements 131a, 131b, 132a, 132b, 133a, 133b, 134a, and 134b are shifted outward or inward, symmetrically from the center on a straight line in the direction of the Γ-K crystal orientation. The shift direction is indicated by arrows in FIG. 1.

First, the amount of outward shift of the positions of the first lattice element pair (lattice elements 131a and 131b), that is, the first pair from the resonator center is 0.42 to 0.5 times the lattice constant of the photonic crystal. Here, the shift is made on a straight line in the direction of the -K crystal orientation and symmetrical with respect to the resonator center.

Here, to make the Q factor in the first-order resonant mode high enough to obtain laser oscillation, the shift amount of the positions of the first lattice element pair may be 0.40 a or more. Meanwhile, to suppress oscillation in the competing base mode, the Q factor in the base mode needs to be sufficiently lower than that in the first-order higher resonant mode. For this purpose, the shift amount of the positions of the first lattice element pair needs to be 0.42 a or more. Also, if the shift amount of the positions of the first lattice element pair is greater than 0.50 a, the performance begins to decline. Accordingly, the shift amount of the first lattice element pair is 0.42 a to 0.5 a.

The amount of outward shift of the positions of the second lattice element pair (lattice elements 132a and 132b), that is, the second pair from the resonator center is 0.26 to 0.38 times the lattice constant of the photonic crystal. Here, the shift is made on the aforementioned straight line and symmetrical with respect to the resonator center.

The amount of outward shift of the positions of the third lattice element pair (lattice elements 133a and 133b), that is, the third pair from the resonator center is 0.13 to 0.19 times the lattice constant of the photonic crystal. Here, the shift is made on the aforementioned straight line and symmetrical with respect to the resonator center.

The amount of outward shift of the positions of the fourth lattice element pair (lattice elements 134a and 134b), that is, the fourth pair from the resonator center is −0.1 to 0 times the lattice constant of the photonic crystal. Here, the shift is made on the aforementioned straight line and symmetrical with respect to the resonator center. In this case, in other words, the amount of inward shift of the positions of the fourth lattice element pair is 0 to 0.1 times the lattice constant of the photonic crystal. Here, the shift is made on the aforementioned straight line and symmetrical with respect to the resonator center. To increase the Q factor in the first-order resonant mode, the best result is achieved when the shift amount of the fourth lattice element pair is −0.07 a, and the performance does not degrade much with a shift amount of up to −0.1 a. However, the performance degrades when the shift amount reaches −0.15 a.

By carrying out the mode of the photonic crystal optical device according to embodiments of the present invention such that each of the above conditions is satisfied, the Q factor in the first-order higher mode exceeds 10,000, and the Q factor in the base mode is suppressed to a lower level. As a result, continuous oscillation of the laser in the first-order higher mode can be obtained. Here, for example, excitation by means of injection of a current of around 10 μA into the active medium 105 has been assumed.

Next, the results of the simulation will be described. Here, the following conditions were assumed. It is assumed that the thickness of the base portion 102 that is made of silicon with a refractive index of 3.46 is 250 nm, the lattice constant a is 420 nm, and the hole radius r of each lattice element is 101.5 nm. The active medium 105, which has a multiple quantum well structure, has a length of 950 nm in the direction of the resonator and a width of 300 nm. The thickness of a well layer that constitutes the active medium 105 is 5 nm.

Figure 2:
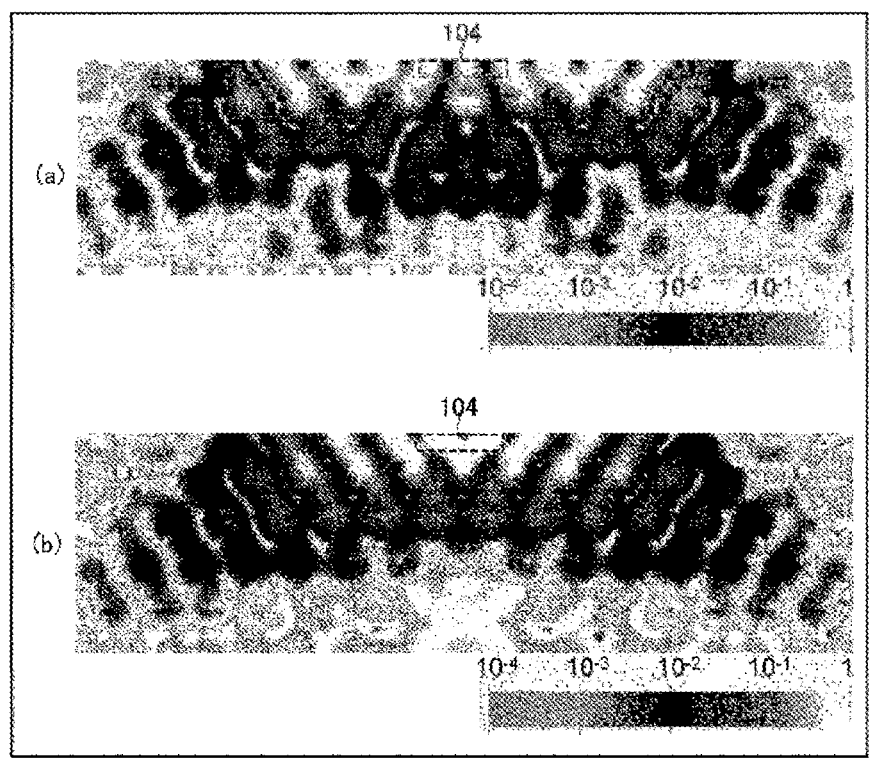
FIG. 2 is a distribution diagram showing distributions of electric fields in a first-order higher mode (a) and a zero-order base mode (b) of the photonic crystal optical device in the embodiment that are obtained by FDTD calculation.

Electromagnetic field simulation in the resonator first-order higher mode was conducted for this photonic crystal photonic device, using a three-dimensional FDTD method (See FIG. 2). The shift amount s1 of the first lattice element pair was 0.46a, the shift amount s2 of the second lattice element pair was 0.34 a, the shift amount s3 of the third lattice element pair was 0.160 a, and the shift amount s4 of the fourth lattice element pair was −0.70 a. A Q factor of 81,000 was obtained at a resonator wavelength λ of 1503 nm in the first-order higher mode. In a sample that was actually produced in the designing, continuous oscillation of the laser in the first-order higher mode was obtained with excitation by means of current injection into the active medium 105.

As has been reported in Non-Patent Literature 3, an L-resonator has the base mode and the first-order higher mode. Meanwhile, in the conventional technology, the use of the base mode and higher Q factors have attracted attention, whereas an active use of the first-order higher mode has not been envisioned. Patent Literature 1 and Non-Patent Literature 3 describe designs that maximize the Q factor in the base mode, and differ from embodiments of the present invention, which maximizes the Q factor in the first-order higher mode while suppressing the Q factor in the base mode.

The base mode and the first-order higher mode of an L-resonator are in an inverse relationship with respect to whether the resonator center is a node or an antinode relative to the Γ-K crystal orientation along the light confinement portion 104 and the lattice element pairs 131, 132, 133, and 134. In the case of an L2 resonator, the electric field in the base mode is an odd function and the resonator center is node, while the electric field in the first-order higher mode is an even function and the resonator center is an antinode. Therefore, the interaction between the base mode and the active layer is suppressed near the center of the L2 resonator, and meanwhile, the interaction between the first-order higher mode and the active layer is enhanced.

If a laser is designed to oscillate in the base mode in a conventional manner, the emission efficiency is lost near the resonator center for the above reasons. In addition, the Q factor in the first-order higher mode is lower than that in the base mode, and thus, laser oscillation does not occur in the first-order higher mode. However, since the first-order higher mode strongly interacts with the active layer and has a high radiation recombination efficiency, the injected current partially performs radiation recombination in the first-order higher mode and is consumed, which further degrades the laser device efficiency.

According to embodiments of the present invention, when the first-order higher mode of an L2 resonator is used for laser oscillation, the interaction with the active layer at the resonator center is strong as mentioned above, and thus, the laser device efficiency increases. Meanwhile, in the base mode, the interaction with the active layer at the resonator center is weak, and thus, the consumption of injected current due to radiation recombination is suppressed. As a result, it is possible to increase the laser device efficiency and optical output as a whole.

The characteristic of the L2 resonator that the first-order higher mode strongly interacts with the medium in the light confinement portion or the active layer increases device performance of not only lasers and light-emitting diode devices but also active optical devices such as optical memories, optical receiver, and optical modulators. Thus, embodiments of the present invention are useful for these devices. For example, an active medium placed in a BH active layer may be any of materials such as InGaAs, which can efficiently absorb signal light and convert the absorbed signal light into electrical signals in the case of optical receivers, and quantum wells that include such InGaAs, as well as materials such as InGaAsP that has a high optical nonlinearity in optical devices such as optical modulators, optical switches, and optical memories.

The characteristic that the resonator center of the L2 resonator is a node of a base-mode electric field and is an antinode of a first-order higher-mode electric field is also common in L4 and L6 resonators. Although the shift of the lattice element pairs of embodiments of the present invention is limited to the L2 resonator, the same effects can be obtained with optical devices with L4 and L6 resonators if similar Q-factor control is realized. However, in such optical devices, the light confinement is larger, and a plurality of electric field antinodes is included therein in both the base mode and the first-order higher mode. For this reason, the effects of embodiments of the present invention are limited and obscure compared to the L2 resonator.

Note that the present invention is not limited to the embodiment described above, and it is apparent that many variations and combinations can be carried out by a person with an ordinary skill in the art within the technical idea of the present invention.

REFERENCE SIGNS LIST

101 Photonic crystal body
102 Base portion
103 Lattice element
104 Light confinement portion
105 Active medium
131a, 131b, 132a, 132b, 133a, 133b, 134a, 134b Lattice element

The invention claimed is:

1. A photonic crystal optical device comprising:
   a photonic crystal body including:
      a base portion; and
      a plurality of lattice elements with a columnar shape that are periodically disposed in a triangular lattice at intervals of a wavelength of target light or less in the base portion, the plurality of lattice elements having a refractive index different from that of the base portion;
   a light confinement portion in the photonic crystal body and having two point defects provided by a portion of the photonic crystal body in which none of the plurality of lattice elements are present;
   an active medium in the light confinement portion; and
   a first lattice element pair, a second lattice element pair, a third lattice element pair, and a fourth lattice element pair that are continuously arranged on a straight line in a direction of a Γ-K crystal orientation of the photonic crystal;

wherein each of the first lattice element pair, the second lattice element pair, the third lattice element pair, and the fourth lattice element pair are disposed on opposing sides of the light confinement portion;

wherein the light confinement portion is disposed at a center of the straight line;

wherein an amount of outward shift of the first lattice element pair is symmetrical with respect to the center of the straight line and is 0.42 to 0.5 times a lattice constant of the photonic crystal;

wherein an amount of outward shift of the second lattice element pair is symmetrical with respect to the center on the straight line and is 0.26 to 0.38 times the lattice constant of the photonic crystal;

wherein an amount of outward shift of the third lattice element pair is symmetrical with respect to the center on the straight line and is 0.13 to 0.19 times the lattice constant of the photonic crystal;

wherein an amount of outward shift of the fourth lattice element pair is symmetrical with respect to the center on the straight line and is −0.1 to 0 times the lattice constant of the photonic crystal; and wherein the first lattice element pair, the second lattice element pair, the third lattice element pair, and the fourth lattice element pair are arranged in this order from the center of the straight line.

2. The photonic crystal optical device according to claim 1, wherein the base portion is made of a semiconductor having a refractive index of 2 or more at an operating wavelength.

3. The photonic crystal optical device according to claim 1, wherein the active medium is disposed at a center of the light confinement portion.

4. The photonic crystal optical device according to claim 1, wherein the active medium is configured to be excited by current injection.

5. A photonic crystal optical device comprising:
a photonic crystal body including:
a base portion; and
a plurality of lattice elements with a columnar shape that are periodically disposed in a triangular lattice at intervals of a wavelength of target light or less in the base portion, the plurality of lattice elements having a refractive index different from that of the base portion;
a light confinement portion in the photonic crystal body and having two point defects provided by a portion of the photonic crystal body in which none of the plurality of lattice elements are present;
an active medium in the light confinement portion; and
a first lattice element pair arranged on a straight line in a direction of a Γ-K crystal orientation of the photonic crystal;

wherein the first lattice element pair is disposed on opposing sides of the light confinement portion;

wherein the light confinement portion is disposed at a center of the straight line;

wherein an amount of outward shift of the first lattice element pair is symmetrical with respect to the center of the straight line and is 0.42 to 0.5 times a lattice constant of the photonic crystal; and wherein the first lattice element pair is arranged closest to the light confinement portion among all lattice element pairs on the straight line.

6. The photonic crystal optical device of claim 5, further comprising a second lattice element pair arranged on the straight line, wherein the second lattice element pair is disposed on opposing sides of the light confinement portion, and wherein an amount of outward shift of the second lattice element pair is symmetrical with respect to the center on the straight line and is 0.26 to 0.38 times the lattice constant of the photonic crystal.

7. The photonic crystal optical device of claim 6, wherein the first lattice element pair is arranged between the second lattice element pair and center of the straight line.

8. The photonic crystal optical device of claim 6, further comprising a third lattice element pair arranged on the straight line, wherein the third lattice element pair is disposed on opposing sides of the light confinement portion, and wherein an amount of outward shift of the third lattice element pair is symmetrical with respect to the center on the straight line and is 0.13 to 0.19 times the lattice constant of the photonic crystal.

9. The photonic crystal optical device of claim 8, wherein the second lattice element pair is arranged between the third lattice element pair and the first lattice element pair.

10. The photonic crystal optical device of claim 8, further comprising a fourth lattice element pair arranged on the straight line, wherein the fourth lattice element pair is disposed on opposing sides of the light confinement portion, and wherein an amount of outward shift of the fourth lattice element pair is symmetrical with respect to the center on the straight line and is −0.1 to 0 times the lattice constant of the photonic crystal.

11. The photonic crystal optical device of claim 10, wherein the third lattice element pair is arranged between the fourth lattice element pair and the second lattice element pair.

12. The photonic crystal optical device according to claim 5, wherein the base portion is made of a semiconductor having a refractive index of 2 or more at an operating wavelength.

13. The photonic crystal optical device according to claim 5, wherein the active medium is disposed at a center of the light confinement portion.

14. The photonic crystal optical device according to claim 5, wherein the active medium is configured to be excited by current injection.

* * * * *